United States Patent
Chen et al.

(10) Patent No.: US 9,293,606 B2
(45) Date of Patent: Mar. 22, 2016

(54) SEMICONDUCTOR DEVICE WITH SEAL RING WITH EMBEDDED DECOUPLING CAPACITOR

(75) Inventors: Kuo-Ji Chen, Wu-Ku (TW); Wei Yu Ma, Taitung (TW); Ta-Pen Guo, Cupertino, CA (US); Hsien-Wei Chen, Sinying (TW); Hao-Yi Tsai, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 617 days.

(21) Appl. No.: 13/296,410

(22) Filed: Nov. 15, 2011

(65) Prior Publication Data

US 2013/0119449 A1    May 16, 2013

(51) Int. Cl.
| | |
|---|---|
| *H01L 29/93* | (2006.01) |
| *H01L 29/94* | (2006.01) |
| *H01L 23/522* | (2006.01) |
| *H01L 23/528* | (2006.01) |
| *H01L 23/58* | (2006.01) |
| *H01L 27/06* | (2006.01) |
| *H01L 27/08* | (2006.01) |
| *H01L 49/02* | (2006.01) |

(52) U.S. Cl.
CPC .......... *H01L 29/93* (2013.01); *H01L 23/5223* (2013.01); *H01L 23/5286* (2013.01); *H01L 23/585* (2013.01); *H01L 27/0629* (2013.01); *H01L 27/0805* (2013.01); *H01L 28/60* (2013.01); *H01L 29/94* (2013.01); *H01L 2924/0002* (2013.01)

(58) Field of Classification Search
CPC ..... H01L 23/5223; H01L 23/02; H01L 23/04; H01L 23/06; H01L 23/10; H01L 23/5225; H01L 23/60; H01L 27/0629; H01L 27/0805; H01L 29/93; H01L 29/94
USPC .................. 257/508, 659, E23.114, E23.191, 257/E23.193
See application file for complete search history.

(56) References Cited

U.S. PATENT DOCUMENTS

| | | | |
|---|---|---|---|
| 7,701,277 B2 * | 4/2010 | Toffolon et al. | ............... 327/310 |
| 7,888,777 B2 | 2/2011 | Hayasaki | |
| 2007/0241422 A1 * | 10/2007 | Chen | .............................. 257/528 |
| 2008/0079116 A1 * | 4/2008 | Yuan et al. | ..................... 257/531 |
| 2010/0090308 A1 * | 4/2010 | Sardana et al. | ........ 257/E29.343 |
| 2011/0233632 A1 * | 9/2011 | Chen et al. | ..................... 257/300 |

FOREIGN PATENT DOCUMENTS

JP          2011044622 A    *   3/2011

* cited by examiner

*Primary Examiner* — Stephen W Smoot
*Assistant Examiner* — Sun M Kim
(74) *Attorney, Agent, or Firm* — Duane Morris LLP

(57) ABSTRACT

A seal ring for semiconductor devices is provided with embedded decoupling capacitors. The seal ring peripherally surrounds an integrated circuit chip in a seal ring area. The at least one embedded decoupling capacitor may include MOS capacitors, varactors, MOM capacitors and interdigitized capacitors with multiple capacitor plates coupled together. The opposed capacitor plates are coupled to different potentials and may advantageously be coupled to $V_{dd}$ and $V_{ss}$.

20 Claims, 4 Drawing Sheets

SEMICONDUCTOR DEVICE WITH SEAL RING WITH EMBEDDED DECOUPLING CAPACITOR

TECHNICAL FIELD

The disclosure relates to semiconductor devices and methods for manufacturing the same and, more particularly, to integrated circuit chips with seal rings and embedded decoupling capacitors.

BACKGROUND

An integrated circuit (IC) is a miniaturized electronic circuit including semiconductor devices and passive components and which is manufactured in and on the surface of a thin substrate of semiconductor material. Integrated circuits are used for a variety of devices and a multitude of applications due to their low cost and high performance.

A high number of integrated circuits are fabricated simultaneously on a semiconductor substrate. Once the integrated circuits are completed, the semiconductor substrate is sawed into individual chips. Conventionally, the uppermost surfaces of the chips are generally protected by a passivation layer disposed over the integrated circuit. This passivation layer, however, cannot cover the periphery of each chip. Thus, the periphery of each chip is exposed to undesirable moisture and ionic contaminants. Accordingly, metal seal rings are commonly formed around at least the upper periphery of the chip as part of the integrated circuit fabrication process, prior to sawing the substrate. Seal rings are formed of one or multiple metal layers and can provide structural reinforcement and stop undesirable moisture and mobile ionic contaminants from entering chip active circuitry regions and affecting operational reliability.

Decoupling capacitors are also necessary components of integrated circuits. Decoupling capacitors decouple portions of the IC from one another. Noise created by circuit elements is shorted by the decoupling capacitors which are critical for power/ground connection integrity and necessary for achieving high performance and reliable circuit operation. In advanced semiconductor processing operations, the energy consumed per unit area of an integrated circuit device is increasing and the IR drop is worsening due to lessened metal thicknesses, thereby degrading the overall power and ground stability. Accordingly, an increasingly high number of decoupling capacitors is needed. Each decoupling capacitor requires a considerable amount of device area which generally comes at the expense of other device features, however. It would therefore be desirable to provide decoupling capacitors that do not create the above shortcomings on integrated circuit chips.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
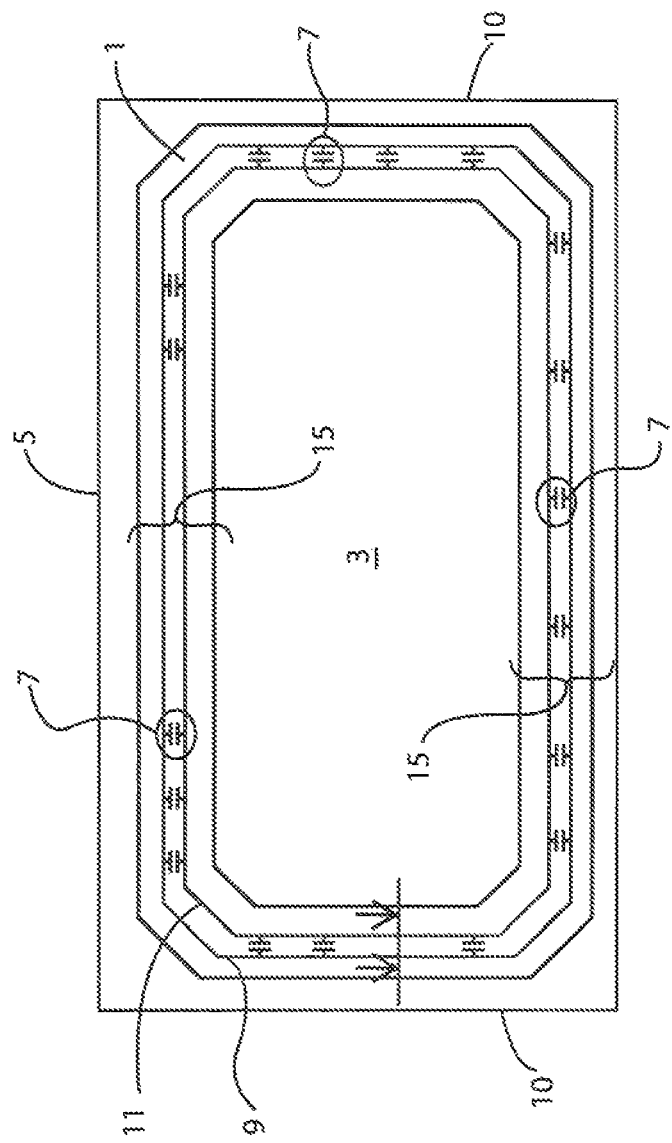
FIG. 1 is a top, plan view of an exemplary seal ring with embedded decoupling capacitors.

FIG. 1 is a plan view showing seal ring 1 surrounding integrated circuit 3 formed on die or chip 10, bounded by scribe line 5. Seal ring 1 extends peripherally around chip 10. A multitude, i.e. hundreds or thousands, of chips 10 are formed simultaneously on a substrate such as a semiconductor substrate or other suitable substrates used in the semiconductor manufacturing industry. Scribe lines 5 extend between the chips 10 and represent the areas which are sawed to separate the individual chips 10 from one another. Integrated circuit 3 may be any of various integrated circuits or other semiconductor devices used in the electronics industry and may be formed using various known or future developed semiconductor fabrication manufacturing operations.

In the illustrated embodiment which is exemplary, seal ring 1 completely surrounds integrated circuit 3, extending along the entire periphery of chip 10 in seal ring region 15 and may include multiple metallization layers. Embedded decoupling capacitors are included within the peripheral region of chip 10 in seal ring region 15. The embedded decoupling capacitors may utilize portions of seal ring 1, they may be disposed below seal ring, or both may be true. In the plan view drawing of FIG. 1, these capacitors are represented schematically as decoupling capacitors 7 using conventional wiring diagram capacitor symbols. Also represented schematically in the symbolically shown capacitors, are the opposed capacitor plates of decoupling capacitors 7, which are coupled to different potentials 9 and 11 which may represent $V_{ss}$ and $V_{dd}$, respectively, in various exemplary embodiments. This representation is intended to be exemplary only and is intended to illustrate the various structural types of decoupling capacitors, as will be shown in further detail later, embedded within seal ring region 15 of chip 10. As will be shown later, the decoupling capacitors may include vertically separated capacitor plates, laterally spaced capacitor plates, diagonally spaced capacitor plates, interdigitized capacitor plates and various other capacitor plates. Alternatively stated, discrete metal portions of seal ring 1 are isolated from one another by a dielectric, and coupled to two or more potentials to form decoupling capacitors in seal ring region 15.

Figure 2:
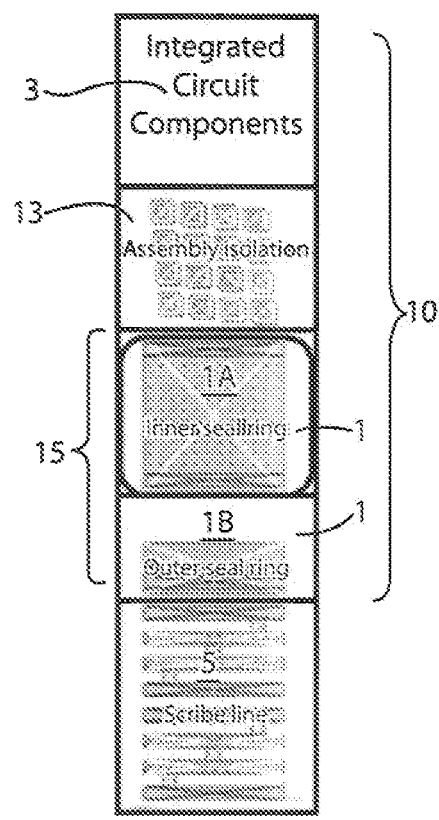
FIG. 2 is a top, plan view of a peripheral portion of a chip showing the interrelation of various features of the disclosure.

FIG. 2 is a top, plan view showing an exemplary arrangement of seal ring 1 and various components on the semiconductor substrate. FIG. 2 illustrates a thin sliver such as may be taken along an edge of chip 10. FIG. 2 shows components of integrated circuit 3 and seal ring 1. Between integrated circuit 3 and seal ring 1 is an assembly isolation region 13 which is optional and may not be used in other exemplary embodiments. Assembly isolation region 13 is void of device features. Seal ring 1 includes inner seal ring 1A and outer seal ring 1B and scribe line 5 is disposed peripherally outside seal ring 1. Seal ring 1 including inner seal ring 1A and outer seal ring 1B is formed in seal ring region 15. Although scribe line 5 and seal ring 1 share a common boundary in FIG. 2, this is exemplary only and seal ring 1 need not necessarily form the outermost border of chip 10. According to various seal ring embodiments known in the art, inner seal ring 1A may contain different components than outer seal ring 1B. In one exemplary embodiment, inner seal ring 1A may be formed to include a stack of conductive and other materials that extend completely across inner seal ring 1A, whereas outer seal ring 1B may include a portion of stacked metal layers and a void portion in which no metal is present. These arrangements are exemplary only and it will be seen that the embedded decoupling capacitors of the disclosure may be formed in the inner seal ring 1A, outer seal ring 1B or both.

Figure 3:
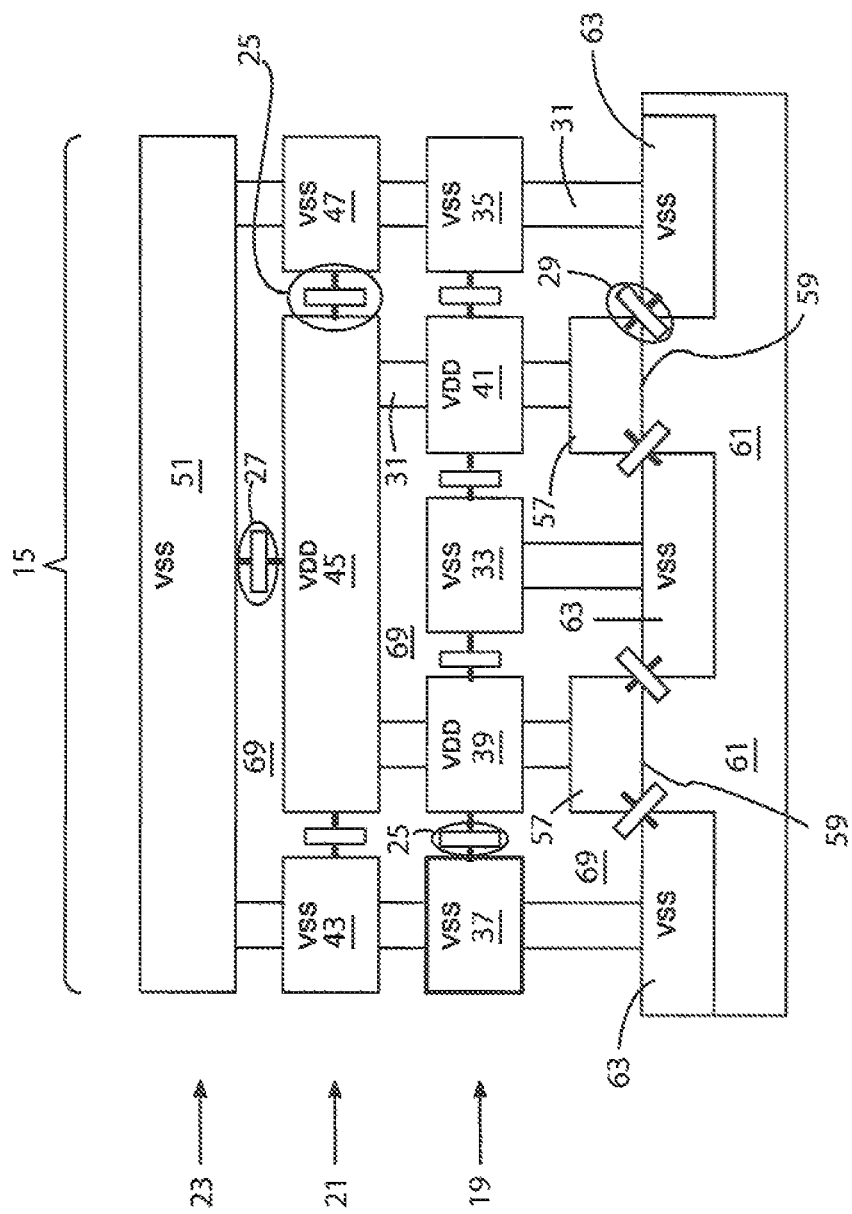
FIG. 3 is a cross-sectional view of an embedded decoupling capacitor according to the disclosure.

FIG. 3 is a cross-sectional view showing an exemplary embedded decoupling capacitor arrangement formed in a peripheral portion of a chip. In the exemplary embodiment, three metal layers are shown, but this is intended to be exemplary only and more or fewer metal layers may be used in the formation of the decoupling capacitor or capacitors. Further, FIG. 3 shows three metal layers formed over a substrate and the three metal layers in the exemplary embodiment may represent metal 1, metal 2, and metal 3 layers as the metal layers appear to be the three lowermost metal layers. According to other exemplary embodiments, the decoupling capacitors may be formed of various different metal layers which may be successive or spaced-apart metal layers. The decoupling capacitors may be formed of back end, BE, features or FE, front end, features. The metal layers of seal ring 1 may be coupled to different potentials, isolated from one another and serve as decoupling capacitors. The decoupling capacitors may be varactors, i.e. a variable reactance diode which has a variable capacitance that is a function of the voltage applied to its capacitor plates. In various exemplary embodiments, the integrated circuit being formed may include various numbers of metal layers. For example, a ten layer metal device may be fabricated and the decoupling capacitors may utilize metal layers from one or several of the ten metallization layers used to form the integrated circuit.

FIG. 3 shows an exemplary embedded decoupling capacitor arrangement formed in seal ring region 15. The decoupling capacitors may include multiple individual capacitors or capacitor plate arrangements formed of multiple discrete capacitor plate segments coupled together. Various capacitor structures and types are used in various exemplary embodiments. In the illustrated embodiment, the decoupling capacitor structures may be formed from first metallization layer 19, second metallization layer 21 and third metallization layer 23. It should be understood that these three metallization layers may represent any of various successive or spaced-apart layers of metallization in a multi-layer metallization device. Discrete metallization sections 33, 35, 37, 39 and 41 are formed of first metallization layer 19. Discrete metallization segments 43 and 47 and metal plate 45 are formed from second metallization layer 21 and metal plate 51 is formed of third metallization layer 23. The metallization components may be formed of aluminum, copper, their alloys or various other suitable materials. Conductive connectors 31 may be vias or other conductive plugs that provide electrical connection between the metalization components.

Capacitor dielectrics 27, 29 and 25 are shown schematically using the conventional circuit symbol for a capacitor. Capacitor dielectric 27 represents a capacitor dielectric separating two vertically spaced capacitor plates. Capacitor dielectric 25 represents a capacitor dielectric separating two laterally spaced capacitor plates and capacitor dielectric 29 represents a dielectric effectively separating diagonally disposed capacitor plate components. In each case, the parallel plate capacitor symbol signifies a capacitor dielectric but it should be understood that this symbolic only and the area between all the conductive components is filled by dielectric 69 which completely fills the region between the capacitor plate segments.

The exemplary capacitors are decoupling capacitors used to decouple one part of an electrical network (circuit) from another. Noise caused by elements in integrated circuit 3 is shunted through the capacitors, reducing the effect of the noise on the rest of integrated circuit 3. The decoupling capacitor(s) embedded in the seal ring area are coupled to $V_{ss}$, $V_{dd}$ or other sources, using conventional wiring means.

In one exemplary embodiment, one decoupling capacitor with laterally separated electrodes may be formed using metal lead 37 as one capacitor plate, metal lead 39 as the opposed capacitor plate and capacitor dielectric 25 disposed therebetween and vertically separating the capacitor plates. Another exemplary decoupling capacitor with vertically separated electrodes may be formed between capacitor plates formed of metal plates 45 and 51 with capacitor dielectric 27 disposed therebetween. Each of the aforementioned capacitors are MOM, metal oxide metal, capacitors. An exemplary MOS, metal oxide semiconductor, capacitor may be formed to include polysilicon lead 57 as one capacitor plate and dopant impurity region 63 as the opposed capacitor plate. Dopant impurity region 63 is formed within semiconductor substrate 61 using any of various means for introducing dopant impurities into such a semiconductor substrate. The dopant impurity region 63 may be a P-type or N-type dopant impurity region. Decoupling capacitor dielectric 29 is schematically illustrated in a diagonal orientation and represents the capacitor dielectric that may be formed along surface 59 and beneath polysilicon lead 57. Along surface 59, an oxide or other dielectric material may be formed that electrically isolates polysilicon lead 57 from dopant impurity region 63. In each case, the opposed capacitor plates may be coupled to different potentials, which may be $V_{dd}$ and $V_{ss}$ in one exemplary embodiment.

According to one exemplary embodiment, the arrangement shown in FIG. 3 may represent a large interdigitized decoupling capacitor including various components. One capacitor plate arrangement may be coupled to $V_{ss}$ as indicated and the other capacitor plate coupled to $V_{dd}$ as indicated. According to this exemplary embodiment, one capacitor plate arrangement may consist of metal plate 51, metallization segment 43, metallization segment 47, metallization segment 37, metallization segment 33, metallization segment 35 and dopant impurity regions 63, such capacitor plate arrangement coupled to $V_{ss}$. The opposed capacitor plate arrangement may include metal plate 45, metallization segment 39, metallization segment 41 and polysilicon leads 57 coupled to $V_{dd}$. The various capacitor electrode components may be coupled to one another by conductive connectors 31, as illustrated.

The decoupling capacitor arrangement illustrated in FIG. 3 within seal ring region 15 may be considered to utilize the metal of the seal ring itself, or may be considered to be disposed beneath the seal ring metals. The seal ring may be formed of one or multiple metallization layers and at least some of the decoupling capacitors which may be vertical or horizontal capacitors, utilize the multiple metallization layers of the seal ring as their capacitor electrodes which are coupled to different potentials. The MOS decoupling capacitors may be considered to be disposed beneath the seal ring metals.

Figure 4:
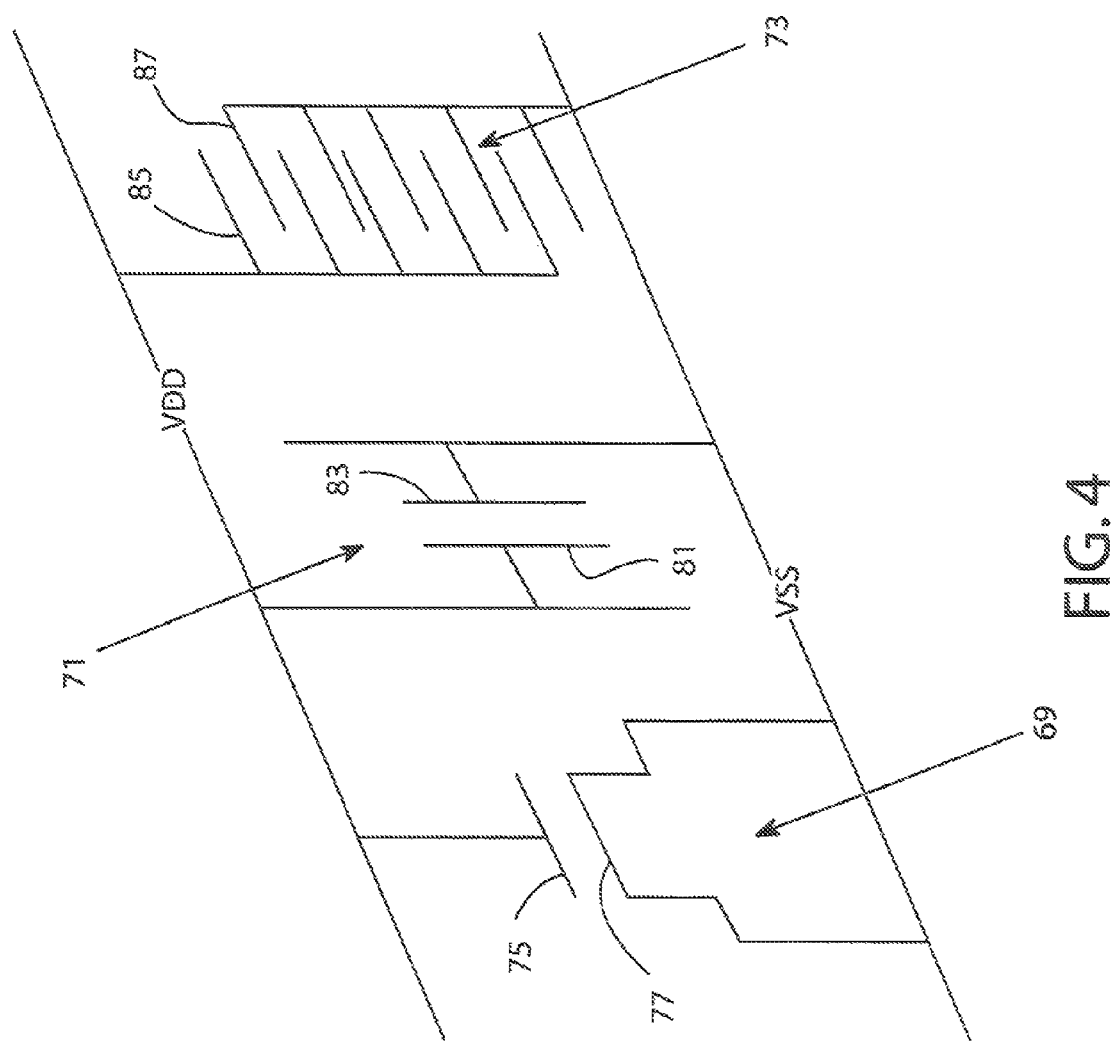
FIG. 4 is a circuit diagram illustrating exemplary decoupling seal ring capacitors.

FIG. 4 is a circuit diagram schematically showing various decoupling capacitor arrangements such as may be included within seal ring region 15. The arrangement of FIG. 4 illustrates three separate capacitor types that are coupled to one another and to $V_{dd}$ and $V_{ss}$ according to one exemplary embodiment but it should be understood that either of the three illustrated decoupling capacitors 69, 71 and 73, may be individually wired. Decoupling capacitor 69 is an MOS capacitor with capacitor plate 75 representing a transistor gate and capacitor plate 77 representing a source/drain area. Decoupling capacitor 69 is seen to be a front end, FE, capacitor formed of front end components. Decoupling capacitor 71 is an MOM capacitor with opposed capacitor plates, 81, 83 laterally spaced by a capacitor dielectric. Decoupling capacitor 73 consists of interdigitized capacitor plates such as may be formed by a stacked arrangement of alternating, opposed parallel capacitor plates. The coupling of capacitor plates 85, and 87 of decoupling capacitor 73 and also of the capacitor plates of decoupling capacitors 69 and 71 are also shown by the $V_{dd}$ and $V_{ss}$ designation in the circuit diagram. Decoupling capacitor 73 may represent a stacked MOM capacitor formed of metal features from multiple, stacked metallization layers. The exemplary opposed capacitor plates may be coupled, in other exemplary embodiments, to potentials other than $V_{dd}$ and $V_{ss}$ and they may be coupled to two or more potentials.

According to one aspect, provided is a semiconductor integrated circuit comprising a chip on a semiconductor substrate, an integrated circuit disposed on the chip, a seal ring surrounding the integrated circuit and disposed on a periphery of the chip, and at least one decoupling capacitor embedded within the seal ring.

According to another aspect, provided is a semiconductor integrated circuit comprising a die on a semiconductor substrate, an integrated circuit formed on the die, a metal seal ring surrounding the integrated circuit and disposed on the semiconductor substrate along a periphery of the die, and at least one decoupling capacitor disposed in the periphery and including at least one capacitor plate formed of the metal seal ring.

According to yet another aspect, provided is a semiconductor integrated circuit comprising a chip on a semiconductor substrate, an integrated circuit formed on the chip, and a seal ring surrounding the integrated circuit and disposed on the semiconductor substrate along a periphery of the chip. The seal ring comprises discrete metal portions isolated from one another by a dielectric, and coupled to two or more potentials.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A semiconductor integrated circuit comprising:
    an integrated circuit formed over a semiconductor substrate;
    an inner seal ring surrounding said integrated circuit and comprising a plurality of first metallization sections;
    an outer seal ring including a plurality of second metallization sections surrounding said inner seal ring, said inner seal ring connected to a different potential than said outer seal ring; and
    at least two decoupling capacitors embedded completely within said inner seal ring or said outer seal ring, at least one of the decoupling capacitors comprising a MOS (metal oxide semiconductor) capacitor including:
        a polysilicon lead conductively coupled to one of the first metallization sections of the inner seal ring, first and second dopant impurity regions formed within said semiconductor substrate and conductively coupled to respective second metallization sections of the outer seal ring, and a capacitor dielectric formed on said semiconductor substrate between said dopant impurity regions.

2. The semiconductor integrated circuit as in claim 1, wherein each decoupling capacitor includes a first capacitor plate coupled to $V_{dd}$ and a second capacitor plate coupled to $V_{ss}$.

3. The semiconductor integrated circuit as in claim 1, further comprising a third metallization section inside the inner seal ring, wherein the third metallization section is connected to the second dopant impurity region.

4. The semiconductor integrated circuit as in claim 3, wherein the third metallization section is configured to be coupled to $V_{ss}$.

5. The semiconductor integrated circuit as in claim 3, wherein said first decoupling capacitor further includes further capacitor plates vertically separated by a capacitor dielectric disposed there between.

6. The semiconductor integrated circuit as in claim 1, wherein said at least two decoupling capacitors comprises an MOM (metal oxide metal) capacitor.

7. The semiconductor integrated circuit as in claim 1, wherein said at least two decoupling capacitors comprises a varactor.

8. The semiconductor integrated circuit as in claim 1, wherein said at least two decoupling capacitors comprises a first capacitor plate arrangement comprising a plurality of discrete portions of a plurality of metallization layers electrically coupled together and a second capacitor plate arrangement comprising a plurality of further discrete portions of said plurality of metallization layers, electrically coupled together,
    wherein a capacitor dielectric material laterally and vertically separates said discrete portions of said first capacitor plate arrangement from said further discrete portions of said second capacitor plate arrangement.

9. The semiconductor integrated circuit as in claim 8, wherein:
- said first capacitor plate arrangement includes laterally spaced first metal leads of a first metal layer, laterally spaced second metal leads of a second metal layer, said laterally spaced second metal leads disposed over at least two said laterally spaced first metal leads, and a metal plate disposed over said laterally spaced second metal leads;
- said second capacitor plate arrangement comprises a pair of laterally spaced further first metal leads of said first metal layer and disposed laterally between said first metal leads, and a further metal plate of said second metal layer and disposed over and extending between said further first metal leads.

10. The semiconductor integrated circuit as in claim 9, wherein said metal plate extends from one said laterally spaced second metal lead to a further said laterally spaced second metal lead and said first capacitor plate arrangement further comprises one said first metal lead laterally disposed between said pair of laterally spaced further first metal leads.

11. The semiconductor integrated circuit as in claim 9, wherein said first capacitor plate arrangement is coupled to $V_{ss}$ and further comprises said dopant impurity region and said second capacitor plate arrangement is coupled to $V_{dd}$ and further comprises said polysilicon gate.

12. The semiconductor integrated circuit as in claim 1, wherein said inner seal ring includes a stack of conductive and other materials that extend completely across said inner seal ring and said outer seal ring includes a portion of stacked metal layers and a void portion in which no metal is present.

13. A semiconductor integrated circuit comprising:
- an integrated circuit formed over a semiconductor substrate;
- an inner metal seal ring surrounding said integrated circuit and comprising a plurality of first metallization sections;
- an outer metal seal ring including a plurality of second metallization sections surrounding said inner metal seal ring, said inner metal seal ring connected to a different potential than said outer metal seal ring; and
- wherein at least two decoupling capacitors are formed completely within said inner metal seal ring or said outer metal seal ring, at least one of the decoupling capacitors comprising a MOS (metal oxide semiconductor) capacitor including:
- a polysilicon lead conductively coupled to one of the first metallization sections of the inner metal seal ring, first and second dopant impurity regions formed within said semiconductor substrate and conductively coupled to respective second metallization sections of the outer metal seal ring, and a capacitor dielectric formed on said semiconductor substrate between said dopant impurity regions.

14. The semiconductor integrated circuit as in claim 13, wherein at least one of said inner and outer metal seal rings comprises a plurality of metallization layers and said at least two decoupling capacitors includes capacitor plates formed of more than one of said plurality of metallization layers.

15. The semiconductor integrated circuit as in claim 13, wherein said at least two decoupling capacitors includes a plurality of first capacitor plates coupled together and to $V_{dd}$ and a second, opposed plurality of capacitor plates coupled to $V_{ss}$.

16. The semiconductor integrated circuit as in claim 13, wherein said at least two decoupling capacitors includes at least a first decoupling capacitor with capacitor electrodes laterally separated by a capacitor dielectric.

17. The semiconductor integrated circuit as in claim 13, wherein said inner metal seal ring includes a stack of conductive and other materials that extend completely across said inner metal seal ring and said outer metal seal ring includes a portion of stacked metal layers and a void portion in which no metal is present.

18. A semiconductor integrated circuit comprising:
- an integrated circuit formed over a semiconductor substrate;
- an inner seal ring surrounding said integrated circuit;
- an outer seal ring surrounding said inner seal ring, said inner seal ring including different components than said outer seal ring;
- at least one of said inner and outer seal rings comprising discrete metal portions isolated from one another by a dielectric, the respective metal portions configured to be coupled to two or more potentials; and
- at least two decoupling capacitors embedded completely within said inner seal ring or said outer seal ring, each including:
- first and second dopant impurity regions formed within said semiconductor substrate; and
- a gate formed above said semiconductor substrate;
- wherein said discrete metal portions include first, second, and third metal segments at a first metallization layer, the first metal segment formed above and electrically coupled to the first dopant impurity region, the second metal segment formed above and electrically coupled to the gate, and the third metal segment formed above and electrically coupled to the second dopant impurity region.

19. The semiconductor integrated circuit as in claim 18, wherein at least one said discrete metal portion is coupled to $V_{ss}$ and at least another of said discrete metal portions is coupled to $V_{dd}$.

20. The semiconductor integrated circuit as in claim 18, wherein said discrete metal portions further include fourth and fifth metal segments at a second metallization layer above the first metallization layer, the fourth metal segment formed above and electrically coupled to the first metal segment, the fifth metal segment electrically coupled to the second metal segment.

* * * * *

UNITED STATES PATENT AND TRADEMARK OFFICE
CERTIFICATE OF CORRECTION

| | | |
|---|---|---|
| PATENT NO. | : 9,293,606 B2 | Page 1 of 1 |
| APPLICATION NO. | : 13/296410 | |
| DATED | : March 22, 2016 | |
| INVENTOR(S) | : Kuo-Ji Chen et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 624 days.

Signed and Sealed this
Fourteenth Day of June, 2016

Michelle K. Lee
*Director of the United States Patent and Trademark Office*